United States Patent [19]
Hatley et al.

[11] Patent Number: 5,791,934
[45] Date of Patent: Aug. 11, 1998

[54] PROBELESS FIXTURE FOR ADAPTER CARD TESTING

[75] Inventors: Jeffrey Alan Hatley, Midland; Jerry Thomas Paradise, Cary; David Timothy Zimmerman, Charlotte; Rondell Kenneth Watts, Concord, all of N.C.

[73] Assignee: International Business Machines Corporation, Armonk, N.Y.

[21] Appl. No.: 656,565

[22] Filed: May 31, 1996

[51] Int. Cl.[6] ............................................ H01R 11/18
[52] U.S. Cl. ................................... 439/482; 439/66
[58] Field of Search .................... 439/482, 66, 327, 439/629, 630, 631, 632, 634, 635, 636, 637, 259, 260, 86, 91

[56] References Cited

U.S. PATENT DOCUMENTS

| | | |
|---|---|---|
| 3,858,958 | 1/1975 | Davies . |
| 3,985,413 | 10/1976 | Evans . |
| 4,473,798 | 9/1984 | Cedrone et al. ............. 324/158 P |
| 5,141,444 | 8/1992 | Redmond et al. .............. 439/91 |
| 5,273,450 | 12/1993 | Renn et al. .................. 439/260 |
| 5,306,161 | 4/1994 | Volz et al. .................... 439/66 |
| 5,308,250 | 5/1994 | Walz ............................ 439/63 |
| 5,313,368 | 5/1994 | Volz et al. .................. 361/774 |

OTHER PUBLICATIONS

"High–Density Probing Using Elastomeric Connectors," *IBM Technical Disclosure Bulletin*, vol. 33 No. 5, Oct. 1990, pp. 301–302.

*Primary Examiner*—Khiem Nguyen
*Assistant Examiner*—Yong Ki Kim
*Attorney, Agent, or Firm*—Michele A. Mobley; Jenkens & Gilchrist; Richard M. Goldman

[57] ABSTRACT

A tester having as an interconnect structure a pair of resilient, elastomeric, vise-like interconnect grips having conductive tracings thereon. This interconnect structure provides electrical conduction between the conductive tabs of an adapter card under test and the tester.

10 Claims, 5 Drawing Sheets

PROBELESS FIXTURE FOR ADAPTER CARD TESTING

FIELD OF THE INVENTION

The invention relates to testers for printed circuit boards in a personal computer or work station environment. According to the method and apparatus of the invention there is provided a tester having as an interconnect structure a pair of resilient, elastomeric, vise-like interconnect grips having conductive tracings thereon. This interconnect structure provides electrical conduction between the conductive tabs of an adapter card under test and the tester.

BACKGROUND OF THE INVENTION

Personal computer bus speeds (frequencies) are constantly increasing. This means that the bus speeds (frequencies) for adapter cards are also increasing, and, consequently, the bus speeds (frequencies) for testing adapter cards are increasing.

This presents a problem for adapter card testing. As bus speeds (frequencies) increase, signal degradation also increases. Moreover, high frequency signal degradation increases with increasing cable length. This presents a serious problem in the large volume testing of adapter cards.

For example, one present method for testing adapter cards involves contacting the bus conductor tabs on the card under test with spring loaded probes, and passing the signal along system level test ("SLT") cables from the card under test to conductor tabs of a personal computer interface card. The signal length from the card under test to the personal computer interface card can frequently exceed twelve inches. At high bus speeds this signal path length leads to significant signal degradation, making this method of test unreliable.

An alternate test method is to plug the adapter card under test directly into the personal computer interface. This method is effective and works well. However, it has several drawbacks in an actual manufacturing environment. These include connector wear, tab wear, and improper plugging causing, for example, short circuits and hot plugs, and the like. Severe damage may occur to either the adapter card under test or to the test equipment, or to both.

Another alternative is spring loaded probes. The prior art spring loaded probes wear out quickly, can damage the adapter card under test, and are expensive. Moreover, the spring loaded probes of the prior art are relatively long and unshielded and have high inductance and capacitance which limits the test signal frequency. Additionally, the prior art spring loaded probes have to be wired to an interface card which introduces additional inductance and impedance and further limits test signal frequency. Moreover, debris can prevent the spring loaded probes of the prior art from contacting the tabs of the adapter card under test and can cause the probes to jam and not spring which results in opens.

Thus, there exists a need to quickly test large numbers of adapter cards at high bus speeds (signal frequencies).

SUMMARY OF THE INVENTION

According to the method and apparatus of the invention there is provided a tester having as an interconnect structure a pair of resilient, elastomeric, vise-like interconnect grips having conductive tracings thereon. This interconnect structure provides electrical conduction between the conductive tabs of an adapter card under test and the tester. Thus, there is provided an elastomer based probeless test fixture connector. The connector has an elongate, generally cylindrical or oblate, elastomeric body. The connector has parallel conductive strips or traces perpendicular to the major axis of the elongate, generally cylindrical or oblate, elastomeric body. The adapter card under test is placed directly above the personal computer interface card, with tab to tab alignment provided by the test fixture, and tab to tab electrical connection provided by the test fixture connector.

A pair of facing elastomeric connectors are pushed against the tabs of adapter card under test and the personal computer interface card, e.g., with air actuated pistons or linear slides. Vertically adjacent tabs are electrically connected, but horizontally adjacent tabs are electrically isolated.

The signal travel length can be 0.25 inch or less, thereby avoiding signal degradation. Connector tab wear does not occur because there is no plugging. The absence of plugging also eliminates the opportunity for adapter card damage.

BRIEF DESCRIPTION OF THE DRAWINGS

The invention may be understood by reference to the FIGURES appended hereto.

The same numerals are used for the same elements in each of the FIGURES, and are as follows.

Figure 1:
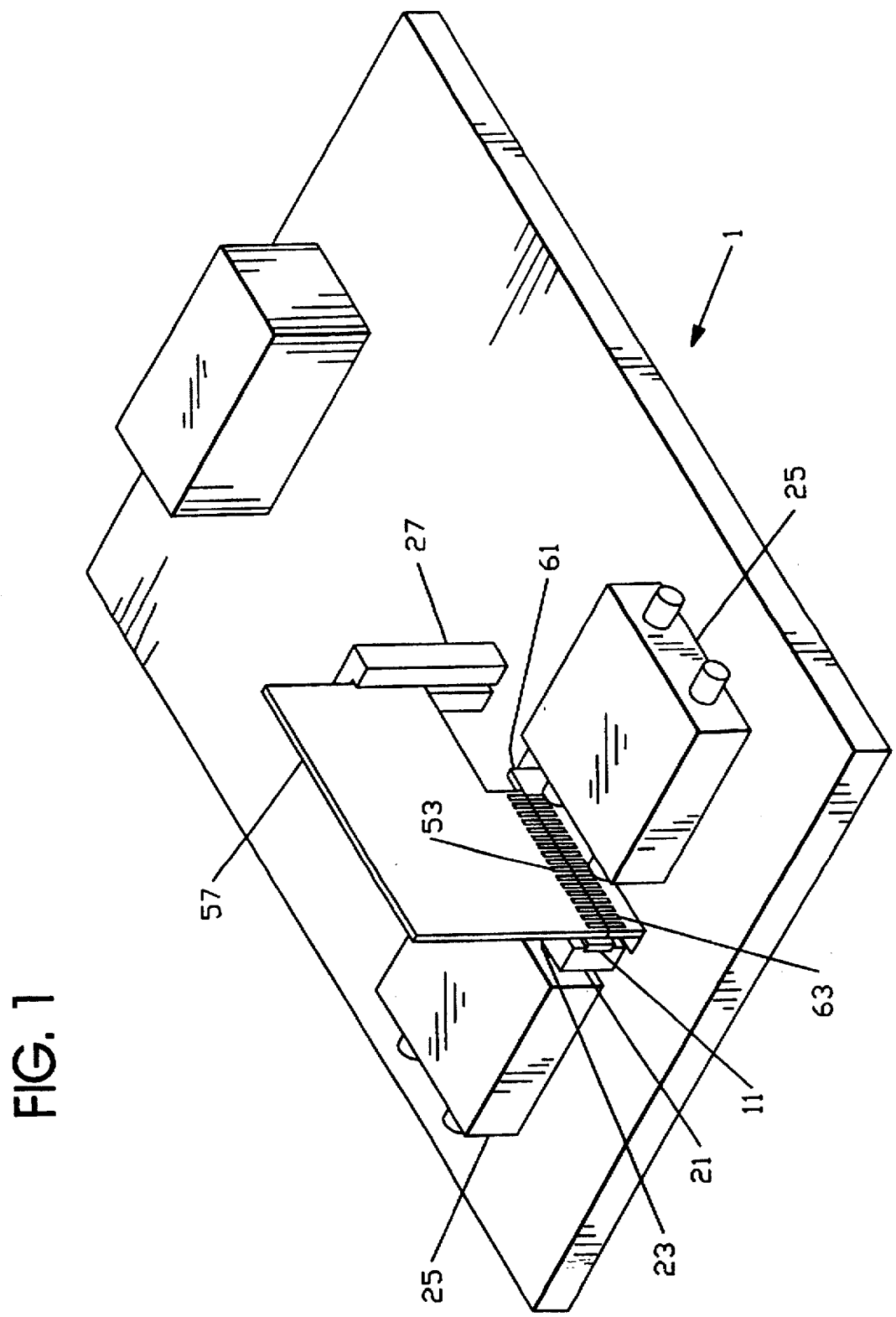
FIG. 1 is a perspective view of portions of the tester of the invention.

1 is the tester, 11 is the elastomeric based connector, 12 is the elastomeric core of connector 11, 13 is the insulating sheath of connector 11, 14 are the conductive traces on connector 11, 21 is a piston for moving connector 11 into position, 23 is a cylinder driving the piston 21, 25 is a controller for controlling the piston 21 and cylinder 23, 27 is a guide slide, 57 is the adapter card under test (CUT), 53 are the conductive connector tabs on CUT 57 under test, 61 is the tester extender card, 63 represents the connector tabs on the extender card 61, 71 represents the anisotropic connector in accordance with a second embodiment of the present invention, 73 represents the interconnect card which provides conductive paths between vertically aligned connectors on the CUT 57 and extender card 61, 77 represents individual conductors which pass through anisotropic connector 71 between CUT 57 and interconnect card 73 and between interconnect card 73 and extender card 61, 81 represents individual conductive elastomeric elements in accordance with a third embodiment of the present invention, and 83 represents a support frame for supporting elastomeric elements 81 in position adjacent to interconnect card 73.

Figure 5:
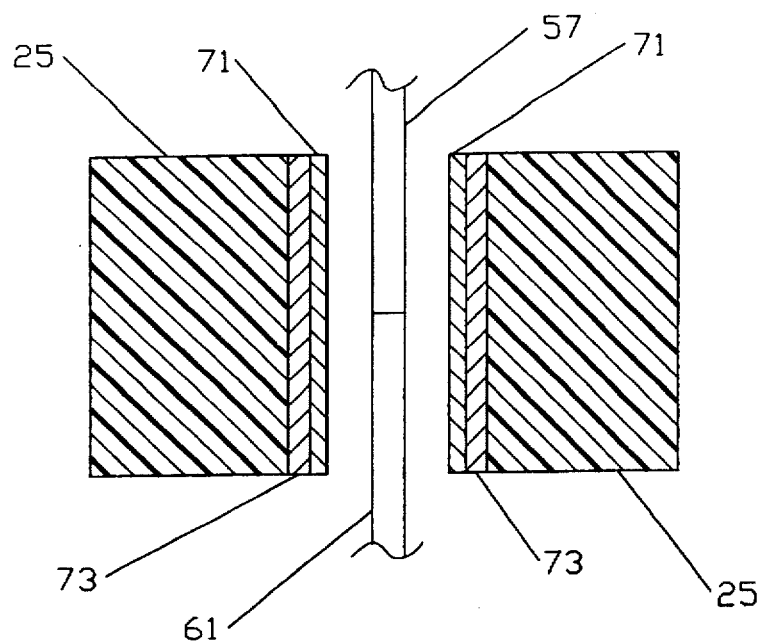

FIG. 5 is a section view of a second embodiment of the present invention.

Figure 6A:
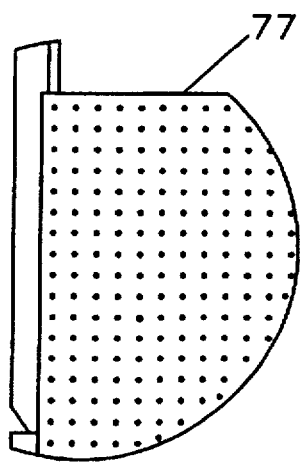

FIG. 6A is a cut-away view of a flexible polymer material for connecting between a card under test and an interconnect card in the test fixture in accordance with the second embodiment of the present invention.

Figure 6B:
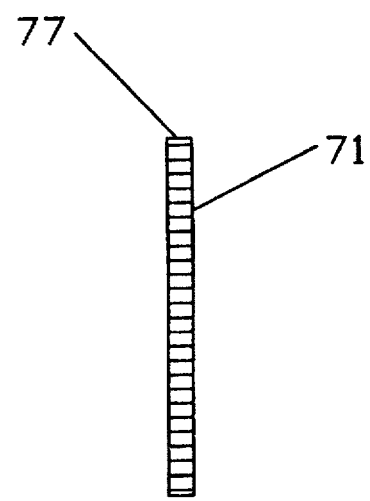

FIG. 6B is a cross-section view of the flexible polymer material of FIG. 6A.

Figure 7:
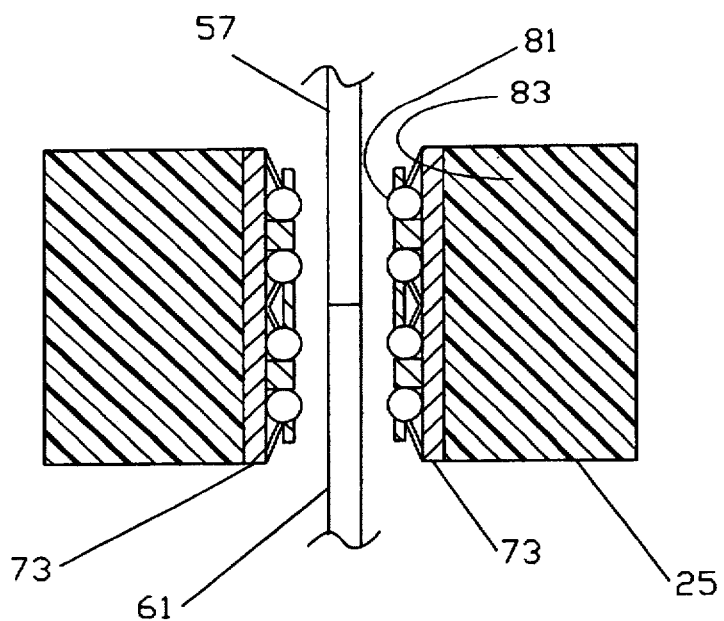

FIG. 7 is a cross-section view of a third embodiment of the present invention.

Figure 8:
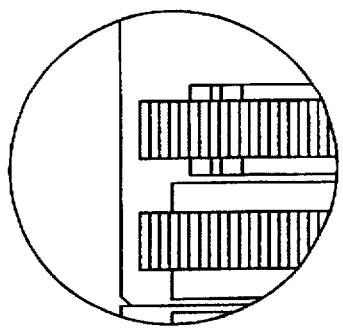

FIG. 8 is a cross-section view of an individual conductive flexible element used in the embodiment shown in FIG. 7.

DETAILED DESCRIPTION OF THE INVENTION

The invention eliminates the need for either spring loaded probes or for hot plugging in order to provide electrical contact of adapter card edge tabs (connectors) for testing adapter cards. The problems of the prior art are eliminated by the tester of the present invention.

Figure 4:
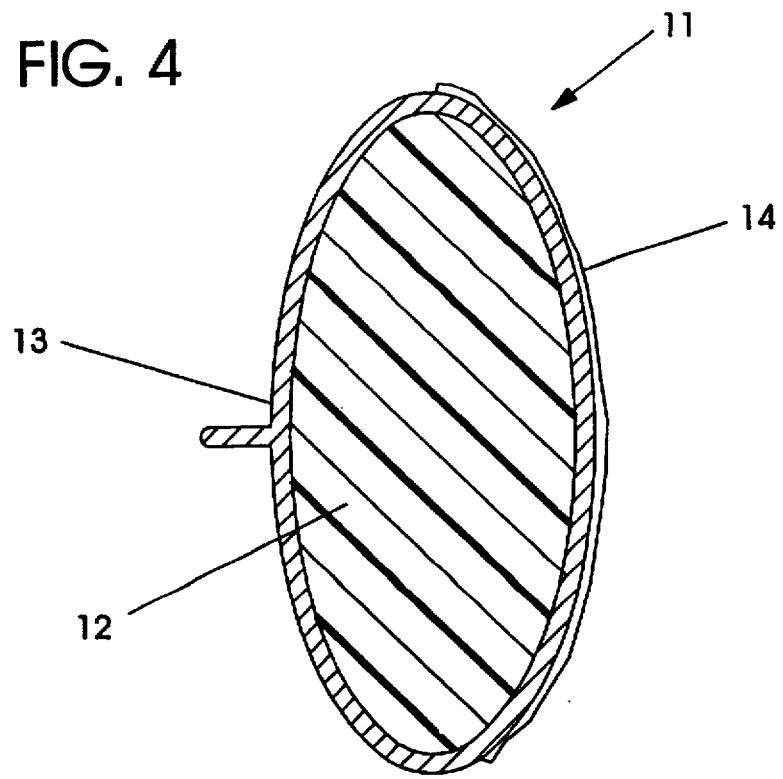
FIG. 4 is a cutaway view of the interconnect structure according to one embodiment of the invention.

According to the method and apparatus of the present invention, there is provided an elastomer based, probeless test fixture connector 11 (see FIG. 4). Connector 11 has an elongate, generally cylindrical or oblate, elastomeric body 12. Connector 11 has parallel conductive strips or traces 14 perpendicular to the major axis of the elongate, generally oblate or cylindrical, elastomeric body 12.

An adapter card under test (CUT) 57 is placed directly above the tester card 61, with tab 53 to tab 63 alignment and electrical connection provided and maintained by connector 11, wherein electrical connection is provided by the traces 14 of connector 11.

Tester 1 (see FIG. 2) has one or more connectors 11, each including an elastic material 12. Connector 11 has elasticity. This elasticity provides conformity with both of the sets 53, 63, of connector tabs, that is, the connector tabs 53 of the adapter card 57 under test, and the tabs 63 of the tester interface 61. The interconnect cores 12 can include silicone rubber or other elastomeric or flexible material, with an external covering, sheath, or layer 13 of a material on which conductive lines 14 can be formed. This external covering, sheath, or layer 13 may, for example, a polyamide film on which the conductive strips 14 are formed.

The interconnect structure 11 of the invention carries test signals from the tester contacts 63 to the adapter card 52 connector tabs 53 through the conductive strips 14.

The tester has mechanical means, as compressive means, shown collectively as elements 21, 23, and 25, for holding at least one of the elongate, oblate or cylindrical connectors 11 in position to electrically interconnect the first contacts 53 (e.g., of the adapter card 57 under test) and the second contacts 63 (e.g., of the tester 61) while maintaining electrical isolation between respective traces or strips 14 connecting adjacent contacts. This element is in the form of mechanical means, as piston means 21, for pressing the conductive strips 11 against a row of card 57 and tester 61 contact tabs 53, 63, to provide good electrical connection between the strips or traces 14 and the connector contacts 53, 63, and for releasing the pressure for removing and inserting adapter cards 57 for testing.

The compressive means 21,23,25, further includes two or more guide slides 27 for extending the elongate, cylindrical connector 11 into a precise position and for retracting the elongate, cylindrical or oblate connector. The compressing means, 21, 23, 25, may also a spring for biasing the cylinder 23 into a retracted position. In the case where the compression means 21, 23, 25, includes an air driven piston 21, automatic control means 25 includes internal valve means, not shown and well known in the art, for regulating the introduction of pressurized air into the cylinder 23 and releasing the air pressure from the cylinder 23. The means for pressing the elongate, cylindrical or oblate connector 11 includes means for simultaneously pressing the individual conductive strips or traces 14 relatively against the aligned tester tabs 63 and the tabs 53 of the adapter card 57 under test to electrically connect each tester tab 53 to the corresponding adapter card tab 63.

The tester 1 provides test signals to the adapter card 57 under test. These test signals are provided through a test interface 61 positioned with interface contact tabs 63 along an edge adjacent to corresponding connector tabs 53 of the adapter card 57 under test when the adapter card 57 and the interconnect structure 61 are in position for testing.

In a further embodiment of the invention the tester 1 includes a presence signal means for determining when a card 57 is present and positioned for testing, and for signaling the presence of the card 57. This presence signal means operates in conjunction with automatic control means for automatically activating the compressive means 11, in response to the presence signal for pressing the traces 14 against the contact pads 53, 63, and for automatically initiating the test signals. The automatic control means may also include means, as bar code means or magnetic strip means, for determining an identification code, part number, serial number, or even a code to a test sequence, for the adapter card 57 under test, and programmed means for recording the card identification. The automatic control means may also include means for monitoring signals received from the adapter card 57 under test and recording the signals in a data base. The recording means for recording resulting test output signals may store the resulting signals in the data base in records related to the identification code for the respective card.

While the invention has been described with respect to certain preferred embodiments and exemplifications, it is not intended to limit the scope of the invention thereby, but solely by the claims appended hereto.

Referring now to FIG. 1, a first embodiment of the present invention will be described. Tester 1 includes a base 3 for supporting various elements of the card test structure. CUT 57 has one edge thereof inserted in guide slide 27 so as to hold CUT 57 in alignment with and vertically positioned above extender card 61 which may be an extender for a test system such as a personal computer (not shown). Conductive connector tabs 53 are vertically aligned with respective conductive tabs 63 on extender card 61.

An elastomeric based connector 11 (see FIGS. 1, 2, and 4) is fixed to movable piston 21 for movement in contact with conductive connector tabs 53 and 63 and away from conductive connector tabs 53 and 63. Movable piston 21 is driven by cylinders 23 under the control of control device 25 which may be a solenoid.

Since it is an important feature of the present invention that connections be made to CUT 57 and extender card 61 with very low friction so as to promote long life of the extender card and minimum wear on the card under test, the mechanical apparatus consisting of controller 25, cylinder 23, and piston 21 is duplicated on the opposite side of the cards 57 and 61 to apply an even force to conductive connector tabs 53 and 63 on both sides of cards 57 and 61, respectively.

Elastomeric based connector 11 provides a deformable connection path from tabs 53 to tabs 63. The connection is made without probes as were required in prior art testers. Connector 11 (see FIG. 4) has an elongate, generally cylindrical or oblate, elastomeric body 12. Parallel conductive strips or traces 14 run perpendicular to the major axis of elastomeric body 12 for providing a conductive path between tabs 53 and 63. A number of conductive strips or traces 14 on connector 12 are spaced apart substantially parallel to each other and substantially perpendicular to the longitudinal axis of connector 12, 11. Conductive strips 14 are electrically isolated from each other by choosing a width of conductive strip or trace 14 which is less than the space between adjacent connector tabs 53 or 63 on cards 57 and 61, respectively. Coating 13 on connector 11 is an exterior insulating coating or sheath which surrounds the elastomeric core 12.

Please note that conductive strips 14 are only on the surface of connector 11 which face the conductive tabs 53 and 63 on cards 57 and 61.

Figure 2:
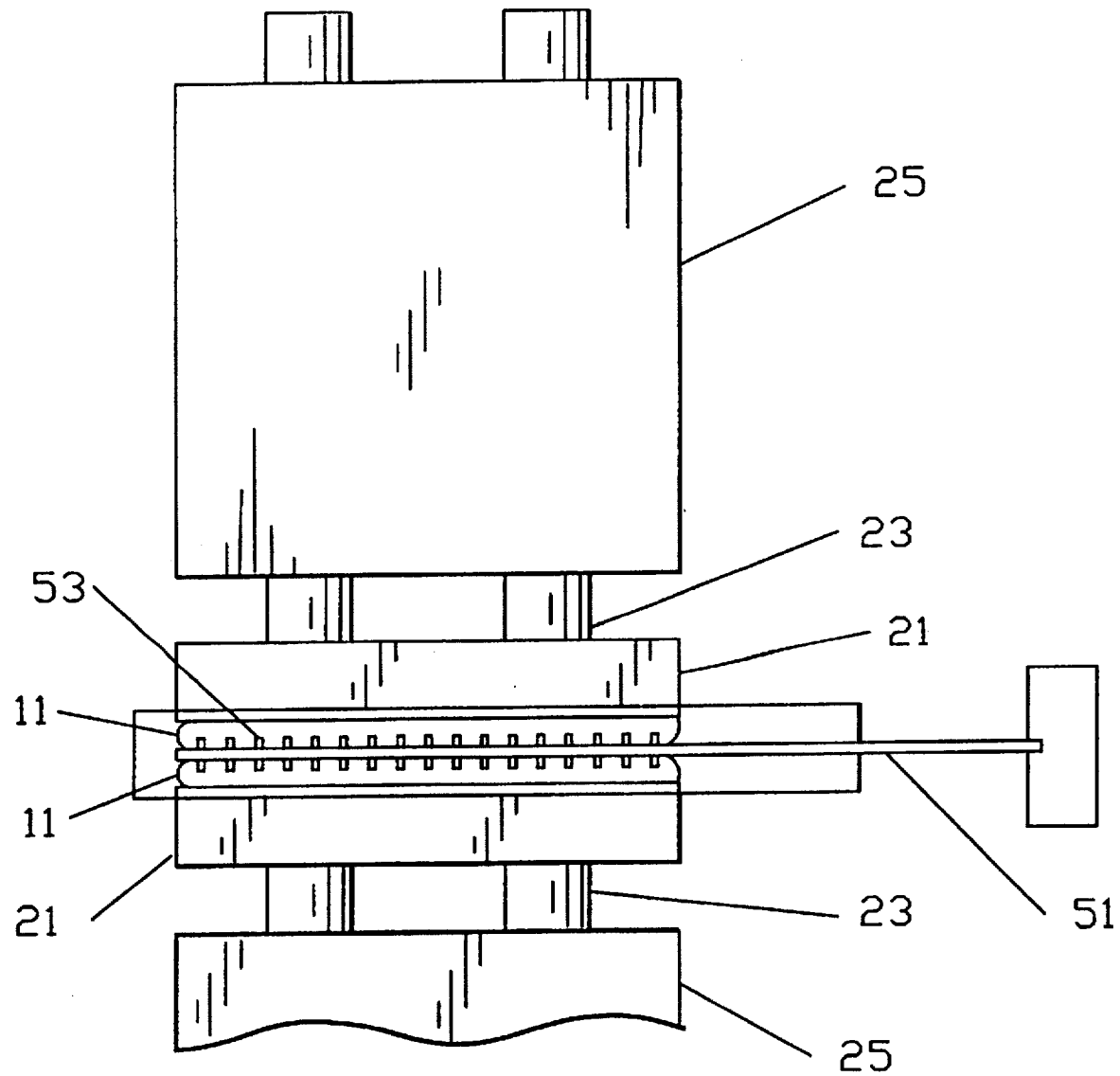
FIG. 2 is a top plan view of portions of the tester of the invention.

Referring now to FIG. 2, a top-plan view of portions of the tester in accordance with the present invention, it can be seen how connectors 11 on either side of card 57 make contact with conductive tabs 53 on CUT 57. It should be noted that FIG. 2 shows the test apparatus with the connector 11 fully engaged or pressed against card 57 and extender card 61 (not shown).

Figure 3:
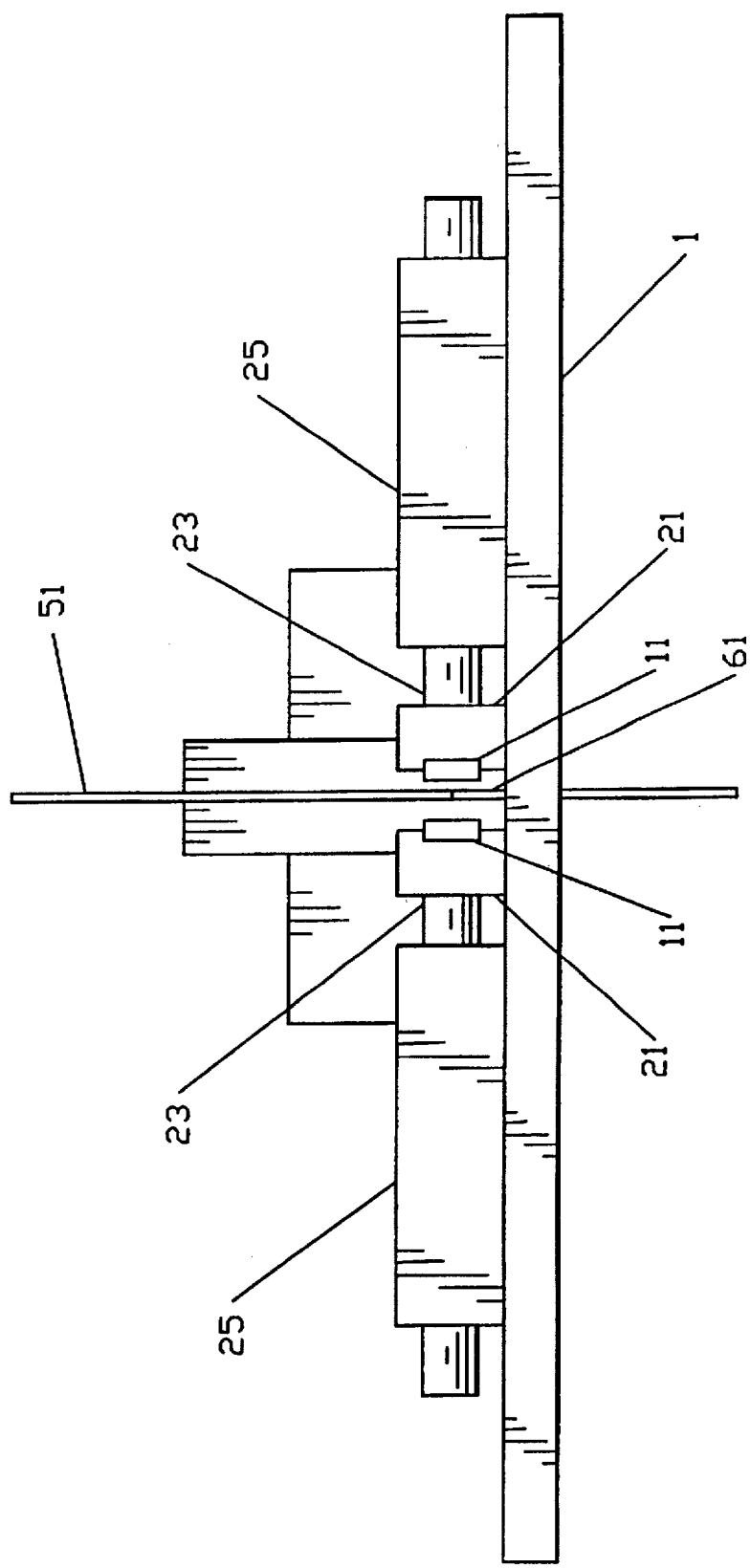
FIG. 3 is an elevation view of portions of the tester of the invention.

Referring now to FIG. 3, a front elevation view of the tester in accordance with the present invention can be seen, wherein pistons 21 have been moved away from cards 57 and 61, allowing card 57 to be removed from the tester without wear or damage to conductive tabs 53.

It should be noted that there may be two or more guide slides 27 for alignment and holding of CUT 57 in tester 1. Also, the compressing mechanism 21, 23, and 25 may also include a spring mechanism (not shown) for biasing cylinder 23 into a retracted position away from cards 57 and 61.

The compression mechanism 21, 23, and 25 may also include an air-driven piston 21, wherein the controller 25 includes an internal valve (not shown) well known in the art for regulating the introduction of pressuized air into cylinder 23 and for releasing the pressurized air from cylinder 23.

Operating voltages and signals are provided to CUT 57 from extender card 61 through tabs 63, to connector 11, to conductive tabs 53, for testing of CUT 57. It should be noted that the use of connector 11 minimizes the conductor length while performing tests on CUT 57. This permits a more accurate test of card 57 as compared to prior art devices having much longer signal length pats.

Tester 1 may also include means for detecting that CUT 57 is in place and positioned for testing. Such a signal might be generated from one or more contact switches at the bottom of guide slides 27. The signal indicating that the CUT 57 is in position for testing may operate in conjunction with an automatic controller for automatically activating the compression mechanism consisting of controller 25, cylinders 23, and piston 21.

Further, a bar code or magnetic strip may be employed for determining an identification code, a part number, a serial number, or a code for a test sequence for CUT 57. Further, tester 1 may include programmed means (not shown) for recording card identification. The value and sequencing of test signals supplied to CUT 57 may be controlled by a test program in the personal computer (not shown) which forms a portion of tester 1. Test output signals from CUT 57 may be stored in a test database in association with an identification code for the particular card under test.

Referring now to FIGS. 5, 6A, and 6B, a second embodiment of the present invention will be described. The second embodiment of the present invention employs the same compression mechanism 21, 23, 25 as was described above with respect to the first embodiment of the present invention. However, in the second embodiment of the present invention, connector 11 is replaced by a two-part connection mechanism consisting of an anisotropic polymer material 71 mounted adjacent to an interconnect block 73. The anisotropic polymer material contains a pattern of fine wires embedded in anisotropic polymer material 71 orthogonal to the major axes of anisotropic polymer material 71 such that conduction occurs from a front surface to a back surface of material 71. Thus, when material 71 is brought into contact with conductive tabs 53 and 63 on cards 57 and 61, conduction occurs from tabs 53 through the wires embedded in polymer material 71 to interconnect block 73 which provides vertical aligned strips for connection to wires in material 71 in electrical contact with conductive tabs 63 on extender card 61.

Typical dimensions involved in material 71 are as follows:

Thickness would be in the order of 0.5 to 1.0 millimeters, thus providing a very short path between conductive tabs 53 and interconnect block 73, and Spacing between the orthogonal wires embedded in material 71 of 0.25 to 0.35 millimeters, thus allowing connections without the need to be concerned about precise alignment while avoiding any short circuit between conductive tabs 53 or 63, respectively.

Referring now to FIGS. 7 and 8, a third embodiment of the present invention will be described. As above, the compression mechanism for use with the third embodiment of the present invention is the same as described with respect to the first embodiment of the present invention. Also, interconnect block 73 is essentially the same as interconnect block 73 described above with respect to the second embodiment of the present invention.

A number of connectors 81 have conductive strips 87 around anisotropic core 89. This anisotropic core 89 is flexible and can absorb a large part of the force resulting from the movement of pistons 21 into contact with cards 57 and 61. The parallel strips of conducting material 87 wound around core 89 provide conduction (as is shown in FIG. 8) from a front surface of connector 81 to a back surface of connector 81, thus providing electrical conductivity from tabs 53 or 63, respectively, to interconnect block 73. Connectors 81 are held in place by a support frame 83 with separation between adjacent connectors 81 maintained by insulating blocks 85 which may be made of rubber or other similar insulating material.

It should be noted that the horizontal spacing of connector 81 is greater than two times the width of the connector 81. A typical set of dimensions for connector 81 would be three milli-inches wide set on seven milli-inch centers.

Although the present invention and its advantages have been described in detail, it should be understood that various changes, substitutions and alterations can be made herein without departing from the spirit and scope of the invention as defined by the appended claims.

What is claimed is:

1. Apparatus for testing printed circuit cards having a first set of contact pads, said apparatus including an interconnect assembly having a second set of contact pads, said apparatus comprising:

at least one elongate interconnect structure comprising a elastomeric core having an electrically insulating sheath, at least one of said elongate interconnect structures having a plurality of conductive traces thereon, said traces being spaced apart to substantially electrically isolate each trace from adjacent traces, each of said conductive traces being perpendicular to a longitudinal axis of the elastomeric core;

means for holding at least one of the interconnect structures in position to maintain electrical interconnection between the first contact pads and the second contact pads while maintaining electrical isolation between adjacent conductive traces; and wherein the conductive traces extend partially around the elastomeric core.

2. Apparatus for testing a printed circuit card having a first set of contact pads, said apparatus comprising:

an interconnect assembly having a second set of contact pads;

at least one elongate interconnect structure comprising a elastomeric core having an electrically insulating sheath, at least one of said elongate interconnect structures having a plurality of conductive traces thereon, said traces being spaced apart to substantially electrically isolate each trace from adjacent traces, each of said conductive traces being perpendicular to a longitudinal axis of the elastomeric core; and means for holding at least one of the interconnect structures in position to maintain electrical interconnection between the first contact pads and the second contact pads while maintaining electrical isolation between adjacent conductive strips; and wherein the holding means further comprises a movable piston means for movement of the interconnect structure in contact with the first set of contact pads and the second set of contact pads.

3. The apparatus of claim 2, wherein the movable piston means is under the control of a control device.

4. The apparatus of claim 3, wherein the control device is a solenoid.

5. The apparatus of claim 2, wherein the movable piston means is duplicated on opposite sides of the printed circuit card under test.

6. Apparatus for testing a printed circuit card having a first set of contact pads, said apparatus comprising:

an interconnect assembly having a second set of contact pads;

at least one elongate interconnect structure comprising a elastomeric core having an electrically insulating sheath, at least one of said elongate interconnect structures having a plurality of conductive traces thereon, said traces being spaced apart to substantially electrically isolate each trace from adjacent traces, each of said conductive traces being perpendicular to a longitudinal axis of the elastomeric core; and means for holding at least one of the interconnect structures in position to maintain electrical interconnection between the first contact pads and the second contact pads while maintaining electrical isolation between adjacent conductive strips; and wherein the holding means is clampless.

7. Apparatus for testing a printed circuit card having a first set of contact pads, said apparatus comprising:

an interconnect assembly with a second set of contact pads wherein the interconnect assembly is an extender card;

at least one elongate interconnect structure comprising a elastomeric core having an electrically insulating sheath, at least one of said elongate interconnect structures having a plurality of conductive traces thereon, said traces being spaced apart to substantially electrically isolate each trace from adjacent traces, each of said conductive traces being perpendicular to a longitudinal axis of the elastomeric core; and means for holding at least one of the interconnect structures in position to maintain electrical interconnection between the first contact pads and the second contact pads while maintaining electrical isolation between adjacent conductive strips.

8. Apparatus for testing a printed circuit card having a first set of contact pads, said apparatus comprising:

an interconnect assembly having a second set of contact pads;

at least one interconnect structure comprising:

an anisotropic polymer material containing an embedded pattern of fine wires orthogonal to the major axes of the anisotropic polymer material such that conduction occurs from a front surface to a back surface of the anisotropic polymer material; and an interconnect block comprising at least one vertical aligned trace in electrical contact with the first set of contact pads and the second set of contact pads, for connection to the fine wires; and means for holding at least one of the interconnect structures in position to maintain electrical interconnection between the first contact pads and the second contact pads while maintaining electrical isolation between adjacent conductive strips.

9. The apparatus of claim 8, wherein the anisotropic polymer materials is on the order of 0.5 to 1.0 millimeters in width.

10. The apparatus of claim 8, wherein the spacing between adjacent orthogonal wires is 0.25 to 0.35 millimeters.

* * * * *